United States Patent [19]

Tanino et al.

[11] Patent Number: 4,826,616

[45] Date of Patent: May 2, 1989

[54] PIEZOELECTRIC PRESSURE-SENSITIVE ELEMENT AND METHOD FOR MAKING SAME

[75] Inventors: Katsumi Tanino; Morihito Nakada, both of Toyama, Japan

[73] Assignee: Toyokako Kabushiki Kaisha, Namerikawa, Japan

[21] Appl. No.: 208,062

[22] Filed: Jun. 17, 1988

[30] Foreign Application Priority Data

Sep. 8, 1987 [JP] Japan .............................. 62-224492

[51] Int. Cl.$^4$ ............................................. C04B 35/00
[52] U.S. Cl. ..................................... 252/62.9; 264/24; 523/442; 523/458; 528/111; 528/117; 528/118
[58] Field of Search ......................... 252/62.9; 264/24; 523/442, 458; 528/111, 118, 117

[56] References Cited

U.S. PATENT DOCUMENTS 4,239,608 12/1980 Pantelis .............................. 252/62.9
4,521,322  6/1985 Broussoux et al. ................ 252/62.9
4,578,442  3/1986 Ohigashi et al. ................... 252/62.9
4,726,099  2/1988 Card et al. ......................... 252/62.9

FOREIGN PATENT DOCUMENTS 51-7498   1/1976 Japan ................................. 252/62.9
51-70245  6/1976 Japan ................................. 252/62.9
53-4897   1/1978 Japan ................................. 252/62.9
53-126200 11/1978 Japan ................................. 252/62.9

*Primary Examiner*—Jack Cooper
*Attorney, Agent, or Firm*—Flynn, Thiel, Boutell & Tanis

[57] ABSTRACT

A piezoelectric pressure-sensitive element comprising a dispersion of a dipolarly oriented ferroelectric ceramic powder in a cured product of a composition comprised of an epoxy resin having at least two epoxy groups in the molecules, a compound having defined numbers of amino groups, benzene rings, carbonyl groups and methylene groups, and a crosslinking agent. A methd for making such a piezoelectric pressure-sensitive element is also described, in which the resin composition comprising a ferroelectric ceramic powder is thermally cured and applied with an electric field at a high temperature to cause dipolar orientation of at least the ceramic powder.

11 Claims, 1 Drawing Sheet

PIEZOELECTRIC PRESSURE-SENSITIVE ELEMENT AND METHOD FOR MAKING SAME

BACKGROUND OF THE INVENTION

1. Field of the Invention

This invention relates to pressure-sensitive elements and more particularly, to piezoelectric pressure-sensitive elements which are useful in detection of a grasping force of a manipulator such as of robots and are also useful as an ultrasonic probe for medical purposes. The invention also relates to a method for making such piezoelectic pressure-sensitive elements.

2. Description of the Prior Art

In recent years, piezoelectric pressure-sensitive elements have wide utility in various fields. These elements make use of a piezoelectric effect in which when a pressure is applied to a material, dielectric polarization takes place along a certain direction, i.e. a positive charge appears at one end with a negative charge developing at the other end. The piezoelectric effect can be utilized to convert mechanical signals expressed by pressure into electric signals.

Known piezoelectric pressure-sensitive elements are, for example, those obtained by sintering a ferroelectric ceramic powder exhibiting the piezoelectric effect such as, for example, lead titanate zirconate (hereinafter abbreviated as PZT) at high temperatures, or by dispersing such a ferroelectric ceramic powder as mentioned above in a thermosetting resin such as an epoxy resin, a thermoplastic resin such as rubber or a ferroelectric resin such as polyvinylidene fluoride (PVDF), or using PVDF alone. However, the piezoelectric pressure-sensitive element using a sintered product of PZT is disadvantageous in that it is hard and brittle, so that when an impact is applied, the element is liable to break readily, thus making it difficult to make a small-size and thin element. This presents a serious problem that when such an element is used in a unit handling fine body such as a manipulator of a robot so as to detect a pressure, an object to be grasped will be broken or the element itself may break.

Accordingly, where the piezoelectric pressure-sensitive element using a sintered product such as of PZT is used in a manipulator of a robot in order to detect a pressure exerted on an object, care should be taken in such a way that an impact force is applied to the object and the pressure-sensitive element only in a degree as small as possible. This entails a complicated control program for controlling the manipulator or a slow operation speed, which is one of the serious trouble factors in the development of highly intelligent robots.

On the other hand, piezoelectric pressure-sensitive elements made of a dispersion of a ferroelectric ceramic powder such as PZT in epoxy resins or PVDF are more flexible than the pressure-sensitive element of a sintered product. However, the piezoelectric strain constant is lower than ½ of the constant of the element of the sintered product, presenting the problem that the pressure sensitivity is low. Moreover, a pressure-sensitive element made of a dispersion of a powder of PZT in rubber involves a similar problem as described above. These problems are considered to be ascribed to the fact that the polymer materials such as epoxy resins, rubbers and the like do not exhibit any piezoelectricity. With PVDF, the problem is raised for the following reason. If a powder such as PZT is dispersed, the resultant dispersion becomes brittle, so that a polarization treatment of the PVDF itself such as by stretching is difficult.

SUMMARY OF THE INVENTION

It is therefore an object of the invention to provide a piezoelectric pressure-sensitive element which can solve the problems of the prior art counterparts.

It is another object of the invention to provide a piezoelectric pressure-sensitive element obtained from a composition which is resistant to impact and can be finely processed to give a small-size or thin element.

It is a further object of the invention to provide a piezoelectric pressure-sensitive element which has high pressure sensitivity equal to that of a known element of a sintered product of PZT and can thus be used for detection of a grasping force of a manipulator of robots or as a medical ultrasonic probe.

It is a still further object of the invention to provide a method for making a piezoelectric pressure-sensitive element as set forth above.

The above objects can be achieved, according to the invention, by a piezoelectric pressure-sensitive element which comprises: a dispersion of a dipolarly oriented ferroelectric ceramic powder in a cured product of a composition made of (1) an epoxy resin having at least two epoxy groups in the molecule; (2) a compound which has, in the molecule, at least two amino groups, at least two benzene rings, at least two carbonyl groups and at least two methylene group units, each unit consisting of at least four methylene groups and in which these groups are, respectively, arranged linearly (which may be hereinafter abbrebiated as "ABCM compound") and (3) a crosslinking agent for the epoxy resin.

The piezoelectric pressure-sensitive element is made by a method which comprises mixing (1) an epoxy resin having at least two epoxy groups in the molecule, (2) a compound which has at least two amino groups, at least two benzene rings, at least two carbonyl groups and at least two methylene group units, each unit consisting of at least 4 methylene groups, and in which these groups are arranged linearly, and (3) a crosslinking agent for the epoxy resin, with a dielectric ceramic powder, thermally curing the mixture by crosslinkage, and applying an electric field to the ceramic powder dispersed in the cured product to cause dipolar orientation. The dipolar orientation is effected at a temperature of from 100° to 180° C. by application of an electric field of, preferably, not less than 10 KV/cm. The dipolarly oriented powder-containing product is cooled down to normal temperature while applying the electric field.

When an epoxy resin which is inherently amorphous in nature is thermally cured and crosslinked after addition of the ABCM compound and a crosslinking agent for the epoxy resin, micro crystals of long chains are formed in the cured product or composition. When an electric field is applied to the cured resin at a suitable temperature, the ferroelectric powder and the micro crystals are dipolarly oriented. Since the ceramic powder and the micro crystals are dispersed throughout the composition, the resultant element can stand an impact force exerted from outside and can be finely worked or processed to permit fabrication of a small-size or thin element. In addition, the element has a high pressure sensitivity substantially equal to that of a sintered product of PZT and can be applied for detection of a grasping force of a manipulator of robots or as an ultrasonic probe for medicines.

The above and other objects, features and advantages of the present invention will become more apparent from the following description taken in conjunction with the accompanying drawings.

DESCRIPTION OF THE PREFERRED EMBODIMENT

Figure 1:
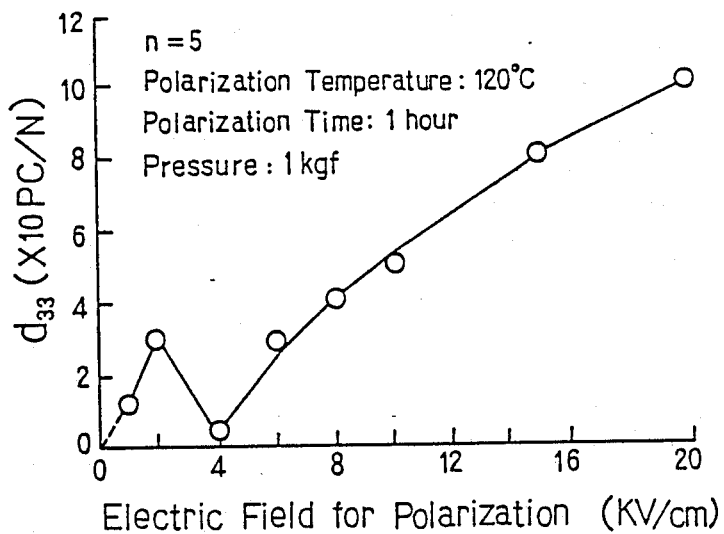
FIG. 1 is a graphical representation of a piezoelectric strain constant, $d_{33}$ of a piezoelectric longitudinal effect in relation to the variation in electric field for polarization, E.

The ferroelectric ceramic powders used in the present invention are any known ferroelectric ceramic powders including lead metallic oxides such as PZT, lead titanate, lead niobate, lead titanate lanthanate zirconate (PLZT) and the like, and lithium niobate, zinc oxide, potassium tantalate niobate, and the like.

The ferroelectric ceramic powders are generally used in large amounts of not larger than 90 wt % in the piezoelectric pressure-sensitive element.

If the amount is too small, the pressure sensitivity becomes unfavorably low. On the contrary, when the amount exceeds 90 %, the moldability deteriorates with a lowering of flexibility.

The ceramic powder should preferably have a size of from about 0.5 to about 100 micrometers.

A base resin in which the ceramic powder is dispersed is a cured resin composition which comprises an epoxy resin having at least two epoxy groups in the molecule and the ABCM compound, and a crosslinking agent for the epoxy resins.

The epoxy resins are not critical provided that they have at least two epoxy groups in the molecule.

Examples of the epoxy resins include epoxidized products of unsaturated carboxylates having conjugated or non-conjugated dienes, or conjugated or non-conjugated cyclic dienes and conjugated or non-conjugated dienes, polyglycidyl ethers obtained by reaction between aliphatic diols, aliphatic polyhydric alcohols, bisphenols, phenol-novolacs or cresol-novolacs and epichlorohydrin or betamethylepichlorohydrin, polyglycidyl esters obtained by reaction between dicarboxylic acids and epichlorohydrin or beta-methylepichlorohydrin, and the like.

The ABCM compounds are polytetramethyleneoxide-di-p-aminobenzoate, which has an amino group at terminal ends thereof, a benzene ring bonded to the inner side of the respective amino groups, a carbonyl group bonded to the inner side of the respective benzene rings, and at least 13 units, each unit consisting of at least 4 methylene groups, provided at the inner side of the respective carbonyl groups. It is preferred that the compound has the amino groups, benzene rings, carbonyl group and methylene groups arranged linearly in the molecule.

The polytetramethyleneoxide-di-p-aminobenzoate is a compound which has in the molecule two amino groups, two benzene rings, two carbonyl groups and 52 methylene groups. In this connection, however, the ABCM compound is not limited to the above aminobenzoate and any compounds may be used as such compounds provided that these compounds have, in the molecule, at least two amino group, at least two benzene rings, at least two carbonyl groups, and at least two units, each unit consisting of at least 4 methylene groups, and these groups are arranged linearly.

The crosslinking agent may be any of curing agents for epoxy resins, accelerator, radical reaction hardener, and the like. Preferably, mixtures of imidazole derivatives and pyridine derivatives are used.

Specific examples of the imidazole derivatives include 2-ethyl-4-methylimidazole, and the like. Specific examples of the pyridine derivatives include 2,6-pyridinecarboxylic acid, 2,5-pyridinedicarboxylic acid, 3,4-pyridinedicarboxylic acid, 3,5-pyridinedicarboxylic acid, 4-pyridineethanesulfonic acid, 3-pyridinesulfonic acid, 4-(aminomethyl) pyridine, 3-(aminomethyl) pyridine, and the like.

The epoxy resin compositions of the ingredients set forth above should preferably comprise 100 parts by weight of the epoxy resin, from (70) to (85) parts by weight of the ABCM compound from (10) to (30) parts by weight of a crosslinking agent.

The method for making the piezoelectric pressure-sensitive element according to the invention is described.

First, an epoxy resin having at least two epoxy groups in the molecule and the ABCM compound are mixed, to which a crosslinking agent for the epoxy resin made, for example, of a mixture of an imidazole derivative and a pyridine derivative is added. Subsequently, a ferroelectric ceramic powder is added to the mixture and dispersed sufficiently.

The mixture is then shaped or cast into a desired form such as a sheet and heated to cause a crosslinking and curing reaction. The curing reaction is preferably effected at 140° to 200° C., more preferably at 150° to 180° C. This is because when the temperature is lower than 140° C., the curing reaction undesirably takes a long time. Over 200° C., the epoxy resin will unfavorably start to evaporate.

The cured product of a desired form is then applied on opposite sides thereof with a conductive paint such as, for example, a conductive silver paint, to form electrodes. A DC electric field is applied between the electrodes at a temperature of from 100° to 180° C., preferably from 120° to 160° C., thereby causing dipolar orientation in the cured product. Subsequently, while keeping the application of the voltage, the temperature is lowered to normal temperatures whereupon the application of the voltage is stopped. The temperature at which the dipolar orientation of the piezoelectric pressure-sensitive element is effected is lower than 100° C., polarization will become insufficient. Over 180° C., there is an undesirable tendency toward dielectric breakdown. The electric field applied for the dipolar orientation should preferably be not less than 10 KV/cm. Below 10 KV/cm, there is the possibility that the polarization does not proceed satisfactorily.

The piezoelectric pressure-sensitive element may be in the form of a sheet as stated above, or may take any forms such as a very thin film of approximately 10 micrometers formed by a screen printing technique when the mixture of the base resin and the ferroelectric ceramic powder is in the form of a paste.

The piezoelectric pressure-sensitive element of the invention has a good resistance to impact force exerted from outside and can be processed finely sufficient to make a small-size or thin element. In addition, the element has such a high pressure sensitivity that it can be used for detection of a grasping force of a manipulator of robots or as a medical ultrasonic probe.

The present invention is more particularly described way of example, which should not be construed as limiting the present invention.

EXAMPLE

Bisphenol F-type epoxy resin (Epikote 807, available from Yuka Shell Epoxy Kabushiki Kaisha) was provided as an epoxy resin having at least two epoxy groups in the molecule. Polytetramethyleneoxide-di-p-aminobenzoate (Elastomer 1000, available from Ihara Chem. Ind. Co., Ltd.) was provided as the ABCM compound. 100 parts by weight of the bisphenol F-type epoxy resin and 85 parts by weight of the polytetramethyleneoxide-di-p-aminobenzoate were mixed under agitation to obtain a uniform solution (a solution having this mixing ratio is hereinafter referred to as solution A).

Thereafter, 2-ethyl-4-methylimidazole (reagent, available from Wako Junyaku Ind. Co., Ltd.) was provided as an imidazole derivative, and 2,6-pyridinecarboxylic acid was provided as a pyridine derivative. 100 parts by weight of 2-ethyl-4-methylimidazole and 50 parts by weight of 2,6-pyridinecarboxylic acid were mixed under agitation to obtain a uniform solution (the solution having this mixing ratio is hereinafter referred to as solution B).

The solution B was added to the solution A in an amount of 10 wt % (the solution having this mixing ratio is hereinafter referred to as solution C).

Lead titanate and lead zirconate were weighed at a molar ratio of 48:52 for use as a ferroelectric ceramic powder and mixed in a self-operating mortar, to which polyvinyl alcohol was added as a binder, followed by mixing, drying and press molding in a mold and sintering twice at a temperature of 1000° C. Thereafter, the resultant sintered product was again milled in the self-operating mortar to make a predetermined size range, thereby obtaining a test powder sample. The powder had an average size of approximately 5 micrometers (hereinafter referred to simply as PZT powder).

The solution C and the PZT powder were weighed to make a mixing ratio by weight of 20:80 and mixed under agitation in a self-operating mortar. The resultant mixture was poured into a Teflon container having an inner dimension of $10 \times 10 \times 1$ cm and degassed under vacuum, followed by curing by crosslinkage at 180° C. for 1 hour.

The resultant sample was cut and processed into test samples having a size of $20 \times 20 \times 0.1$ mm. A conductive silver paint was applied to the sheet sample on opposite sides thereof to form electrodes having a size of $18 \times 18$ mm. An electric field of from 0 to 20 KV/cm was applied between the electrodes at a temperature of 120° C. for 60 minutes and then cooled down to normal temperatures while applying the electric field.

The piezoelectric pressure-sensitive element fabricated in this manner was connected to a charge amplifier to measure a piezoelectric characteristic (piezoelectric strain constant) in relation to the respective electric fields for polarization. The results are shown in FIG. 1.

Figure 2:
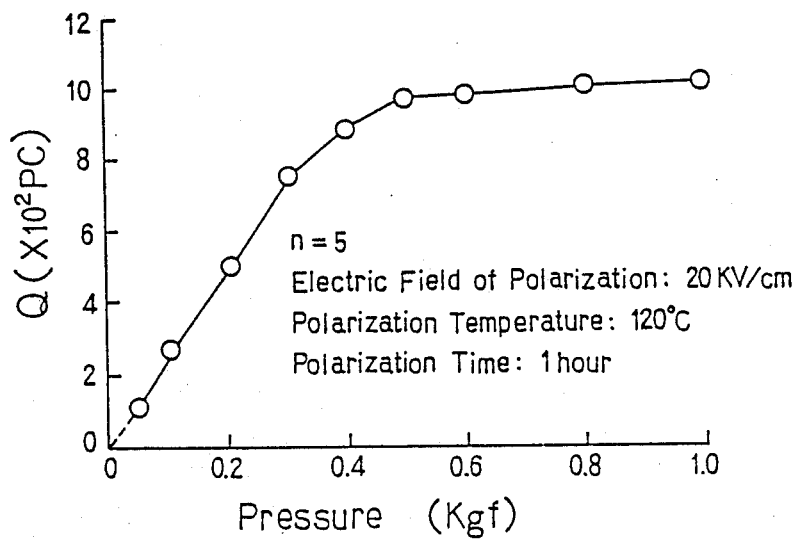
FIG. 2 is a graphical representation of an amount of a generated charge in relation to the variation in pressurizing force.

Moreover, the piezoelectric pressure-sensitive element which had been polarized at an electric field of 20 KV/cm was connected to a charge amplifier and applied with a pressure of from 0 to 1000 gf to determine a quantity of a piezoelectric charge in relation to the variation in pressure. The results are shown in FIG. 2.

The piezoelectric strain constant and the piezoelectric charge were measured in the following manner.

A piezoelectric pressure-sensitive element was set in a piezoelectric strain constant measuring apparatus including a pressure signal generator, a pressurizing unit, a charge amplifier and a synchroscope. The element was pressurized with the pressurizing unit and the resultant electric charge generated in the element was converted into a voltage and displayed on the synchroscope, from which the piezoelectric strain constant and the piezoelectric charge were determined.

In the figures, the units of $d_{33}$ have such meanings that P is pico ($10^{-12}$), C is coulomb, and N is newton.

Although the invention has been described in its preferred form with a certain degree of particularity, it is to be understood that many variations and changes are possible in the invention without departing from the scope thereof.

What is claimed is:

1. A piezoelectric pressure-sensitive element which comprises: a dispersion of a dipolarly oriented ferroelectric ceramic powder in a cured product made from a composition of (1) an epoxy resin having at least two epoxy groups; (2), a compound which has at least two amino groups, at least two benzene rings, at least two carbonyl groups and at least two methylene group units, each unit consisting of at least four methylene groups, said amino groups, benzene rings, carbonyl groups and methylene groups being linearly arranged and (3) a crosslinking agent for the epoxy resin, said cured product having dipolarly oriented microcrystals dispersed therein, the microcrystals having been formed during the curing of said composition.

2. A piezoelectric pressure-sensitive element according to claim 1, wherein said crosslinking agent is a mixture of an imidazole derivative and a pyridine derivative.

3. A piezoelectric pressure-sensitive element according to claim 1, wherein said cured product is made of 100 parts by weight of said epoxy resin, from 70 to 85 parts by weight of said compound, and from 10 to 30 parts by weight of said crosslinking agent.

4. A piezoelectric pressure-sensitive element according to claim 1, wherein said element is in the form of a sheet.

5. A piezoelectric pressure-sensitive element according to claim 1, wherein said ferroelectric ceramic powder is used in an amount of 90 wt % of the total composition.

6. A piezoelectric pressure-sensitive element according to claim 5, wherein said ferroelectric ceramic powder has a size of from 0.5 to 100 micrometers.

7. A piezoelectric pressure-sensitive element according to claim 1, wherein said compound (2) is polytetramethyleneoxide-di-p-aminobenzoate.

8. The piezoelectric pressure-sensitive element according to claim 7, wherein said polytetramethylene oxide-di-p-aminobenzoate has at least 52 methylene groups which are linearly arranged.

9. A method for making a piezoelectric pressure-sensitive element, the method comprising mixing a composition of (1) an epoxy resin having at least two epoxy groups, (2) a compound which has at least two amino groups, at least two benzene rings, at least two carbonyl groups and at least two methylene group units, each unit consisting of at least 4 methylene groups, said amino grops, benzene rings, carbonyl groups and methylene groups being arranged linearly, and (3) a crosslinking agent for the epoxy resin, with a ferroelectric ceramic powder, thermally curing the mixture by cross-linkage, and applying an electric field to the ceramic powder dispersed in the cured product to cause dipolar orientation, said electric field being not less than 10 kV/cm and applied at a temperature of from 100° to 180° C.

10. A method according to claim 9, wherein the thermal curing is effected at a temperature of from 140° to 200° C.

11. A method according to claim 10, further comprising cooling the cured product while applying the electric field.

* * * * *

UNITED STATES PATENT AND TRADEMARK OFFICE
CERTIFICATE OF CORRECTION

PATENT NO. : 4 826 616
DATED : May 2, 1989
INVENTOR(S) : Katsumi TANINO et al

It is certified that error appears in the above-identified patent and that said Letters Patent is hereby corrected as shown below:

Column 6, line 24; change "(2)," to ---(2)---.

Column 6, line 29; change "arranged" to ---arranged,---.

Column 8, line 3; change "claim 10," to ---claim 9,---.

Signed and Sealed this

Ninth Day of January, 1990

Attest:

JEFFREY M. SAMUELS

*Attesting Officer*   *Acting Commissioner of Patents and Trademarks*